(12) United States Patent
Lee et al.

(10) Patent No.: US 12,019,530 B2
(45) Date of Patent: Jun. 25, 2024

(54) TEMPERATURE PREDICTION SYSTEM AND METHOD FOR PREDICTING A TEMPERATURE OF A CHIP OF A PCIE CARD OF A SERVER

(71) Applicants: Inventec (Pudong) Technology Corp., Shanghai (CN); Inventec Corporation, Taipei (TW)

(72) Inventors: Cheng-Ming Lee, Taipei (TW); Kai-Yang Tung, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 201 days.

(21) Appl. No.: 17/340,122

(22) Filed: Jun. 7, 2021

(65) Prior Publication Data
US 2022/0156171 A1    May 19, 2022

(30) Foreign Application Priority Data
Nov. 18, 2020   (CN) .......................... 202011294171.1

(51) Int. Cl.
*G06N 3/08*    (2023.01)
*G06F 1/20*    (2006.01)
(Continued)

(52) U.S. Cl.
CPC .......... *G06F 11/3058* (2013.01); *G06F 1/206* (2013.01); *G06F 11/1476* (2013.01); *G06N 3/08* (2013.01); *H05K 7/20209* (2013.01)

(58) Field of Classification Search
CPC ...... G06F 11/3058; G06F 11/30; G06F 11/00; G06F 1/206; G06F 1/203; G06F 1/20;
(Continued)

(56) References Cited

U.S. PATENT DOCUMENTS

2016/0050789 A1*  2/2016  Bhattacharyya ... H05K 7/20836
                                                              700/282
2020/0073726 A1*  3/2020  Lee ......................... G06N 3/084
(Continued)

OTHER PUBLICATIONS

Narayan "An Artificial Neural Networks based Temperature Prediction Framework for Network-on-Chip based Multicore Platform", 2016, ProQuest LLC, pp. (i)-(vii) and 1-47 (Year: 2016).*
(Continued)

*Primary Examiner* — Mohamed Charioui
(74) *Attorney, Agent, or Firm* — Winston Hsu

(57) ABSTRACT

To predict a temperature of a chip of a PCIe card of a server, use a gated recurrent unit of a recurrent neural network to define a temperature prediction model for the chip, collect training data of the temperature prediction model according to mutual response changes of control variables, use the training data to train the temperature prediction model to obtain a training result close to a measured temperature of the chip and evaluate the training result to obtain features that best reflect the temperature change of the chip, perform an error analysis on the training result to obtain a set of key features from the features, form a temperature predictor according to the set of key features and the temperature prediction model, and generate a predicted temperature of the chip by the temperature predictor.

7 Claims, 4 Drawing Sheets

(51) Int. Cl.
*G06F 11/14* (2006.01)
*G06F 11/30* (2006.01)
*H05K 7/20* (2006.01)

(58) Field of Classification Search
CPC ........ G06F 1/00; G06F 11/1476; G06F 11/14; G06F 11/07; G06F 11/3031; G06F 11/044; G06N 3/044; G06N 3/08; G06N 3/02; G06N 3/00; G06N 3/04; G06N 3/045; H05K 7/20209; H05K 7/20009; H05K 7/20
See application file for complete search history.

(56) References Cited

U.S. PATENT DOCUMENTS

| | | | |
|---|---|---|---|
| 2020/0097431 A1* | 3/2020 | Wang | G06F 13/4221 |
| 2021/0073066 A1* | 3/2021 | Bielby | G06F 11/0739 |

OTHER PUBLICATIONS

Zhang et al. "Machine Learning-Based Temperature Prediction for Runtime Thermal Management Across System Components", Feb. 2018, IEEE, vol. 29, pp. 405-419 (Year: 2018).*

Perez et al. "Thermal Prediction for Immersion Cooling Data Centers Based on Recurrent Neural Networks", 2018, Springer Nature Switzerland AG, pp. 491-498. (Year: 2018).*

* cited by examiner

TEMPERATURE PREDICTION SYSTEM AND METHOD FOR PREDICTING A TEMPERATURE OF A CHIP OF A PCIE CARD OF A SERVER

BACKGROUND OF THE INVENTION

1. Field of the Invention

The present invention relates to a method for predicting the temperature of a server, in particular to a method for predicting a temperature of a chip of a PCIe card of a server using a neural network model.

2. Description of the Prior Art

The ability of a server to dissipate heat directly affects the performance and stability of the server. Therefore, the server is equipped with a baseboard management controller (BMC). Information that manages the operating environment of the server, including power supply, voltage, temperature, fan speed, etc. is handled by the BMC. After the BMC reads the temperature of each component, it will control the fan speed of the server under various conditions so that it can dissipate heat in time.

Most components inside the server, such as a central processing unit (CPU), memory (DIMM), etc., can report their own temperatures to the BMC. However, many high-speed serial computer bus (PCIe, PCI express) cards cannot report temperature information. PCIe card manufacturers only regulate the entrance temperature of the card as the basis for heat dissipation during server design and manufacturing. Therefore, server thermal engineers usually place an ambient temperature sensor in front of the PCIe card to detect the inlet temperature of the PCIe card. Then adjust the fan speed according to the inlet ambient temperature. However, simply relying on the inlet temperature to dissipate heat from the chip on the PCIe card will cause two major problems when designing fan control. First, take the PID (Proportional-Integral-Derivative) controller as an example. If the PID controller is used as the speed control of the inlet temperature of the PCIe card, the temperature control setting must be much lower than the inlet temperature of the PCIe card. Even if the PID feedback control can control the inlet temperature at the set value, if the fan is at a low speed, the inlet air volume of the PCIe card will be insufficient and the chip temperature on the card will overheat. The server is often crashed by the overheating of the PCIe card chip. Therefore, in practice, the fan speed of PCIe card adopts a conservative high speed strategy to ensure its heat dissipation requirements. Second, the PCIe card is usually disposed at the downstream of the fan cooling system of the server. When reading the inlet temperature for fan control, since the sensor is at the downstream, there will be a time delay in controlling the fan speed based on the sensing result, causing a time delay to control the fan speed. More time is required to adjust the controller parameters to achieve better control results.

In order to prevent the chip on the card from overheating, the thermal engineer usually connects a thermocouple sensor to the PCIe card chip during the design phase to monitor the temperature of the chip by using the thermocouple. The control parameters are repeatedly modified and verified to ensure the safety of chip temperature. Usually under the worst scenario, the inlet temperature of the PCIe card is set at 40° C. or lower. As a result, in order to meet the requirements of the inlet temperature of the PCIe card, the system fan is often at a high speed and wastes too much power.

Based on the above problems, conservative temperature control of the PCIe card chip often keeps the fan at a higher speed to prevent the PCIe card from overheating. The main reason is that the chip on the PCIe card cannot report its temperature. Therefore, this invention proposes a method and system design that can estimate the current temperature and predict the temperature of the chip on the PCIe card. This can solve the time delay problem of the fan speed response.

SUMMARY OF THE INVENTION

In an embodiment, a method for predicting a temperature of a chip of a PCIe card of a server comprises using a gated recurrent unit of a recurrent neural network to define a temperature prediction model for the chip, collecting training data of the temperature prediction model according to mutual response changes of a plurality of control variables, using the training data to train the temperature prediction model at the input terminal of the temperature prediction model to obtain a training result close to a measured temperature of the chip from the output terminal of the temperature prediction model, and evaluate the training result to obtain a plurality of features that best reflect the temperature change of the chip, performing an error analysis on the training result to obtain a set of key features from the plurality of features, forming a temperature predictor according to the set of key features and the temperature prediction model, and generating a predicted temperature of the chip by the temperature predictor.

In another embodiment, a temperature prediction system comprises a server, a temperature predictor and a baseboard management controller. The server comprises a PCIe card and a fan. The temperature predictor comprises a temperature prediction model defined by a gated recurrent unit (GRU) of a recurrent neural network (RNN) for a chip of the PCIe card, and a set of key features that best reflect a temperature change of the chip. The baseboard management controller is configured to control a temperature prediction model to generate a predicted temperature of the chip of the PCIe card according to the set of key features, and control a fan speed of the server according to the predicted temperature.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
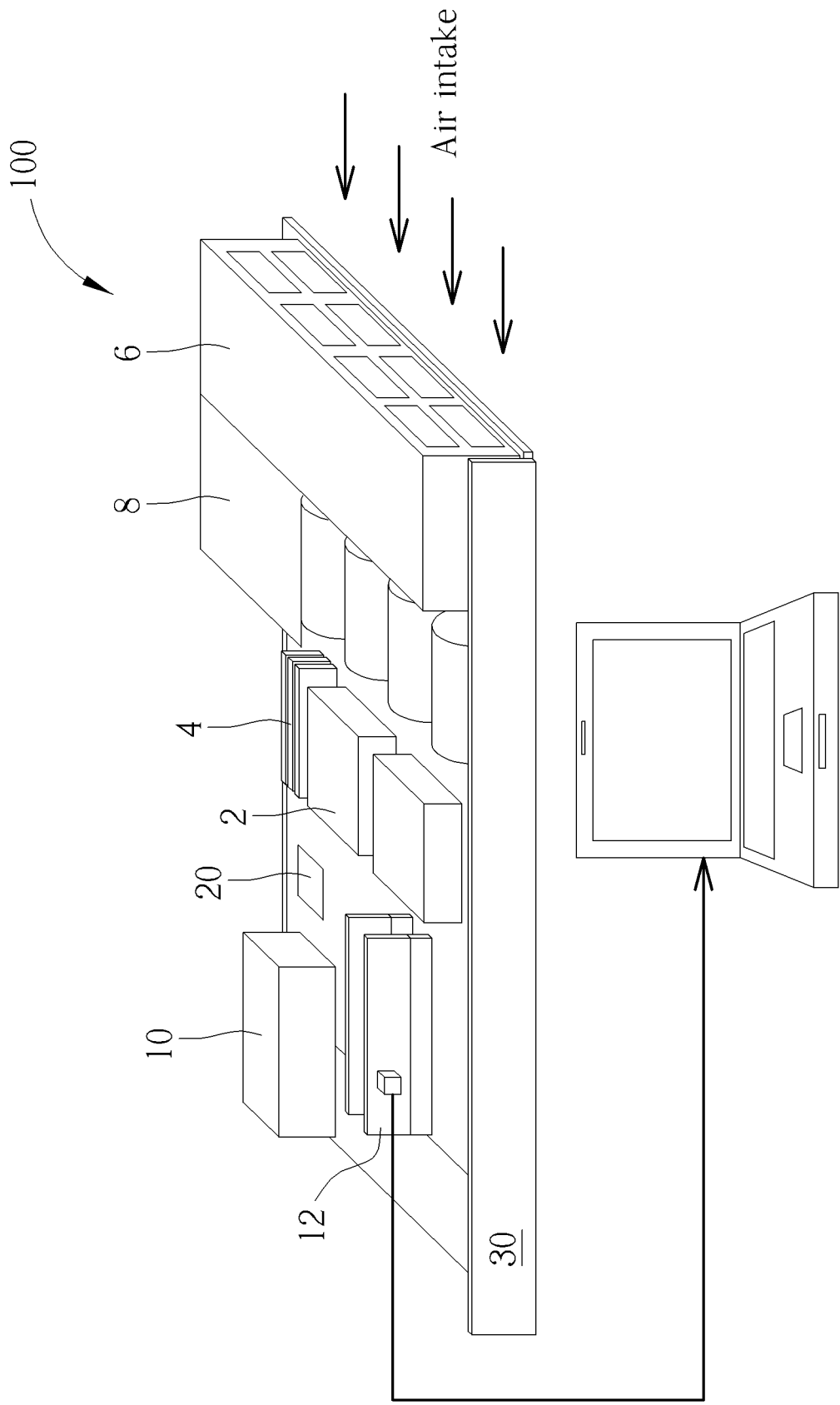
FIG. 1 is a schematic diagram of a temperature prediction system in an embodiment of the present invention.

FIG. 1 is a schematic diagram of a temperature prediction system 100 in an embodiment of the present invention. The temperature prediction system 100 comprises a server 30 and a baseboard management controller 20. The server 30 comprises a central processing unit (CPU) 2, a memory 4, a hard disk module 6, a fan module 8, a power supply 10, and a PCIe (PCI express) card 12. The baseboard management controller 20 is used to control the temperature prediction model to generate the predicted temperature of the chip of the PCIe card 12 according to the key features, and control the speed of the server fan according to the predicted temperature.

The temperature prediction system 100 further comprises a temperature predictor. The temperature predictor comprises a temperature prediction model defined by a gated recurrent unit (GRU) of a recurrent neural network (RNN) for the chip of the PCIe card 12, and a set of key features that best reflect the temperature change of the chip of the PCIe card 12. The temperature prediction model and the set of key features can be stored in the memory 4 and executed by the central processing unit 2. The memory 4 and central processing unit 2 can be in any form.

Figure 2:
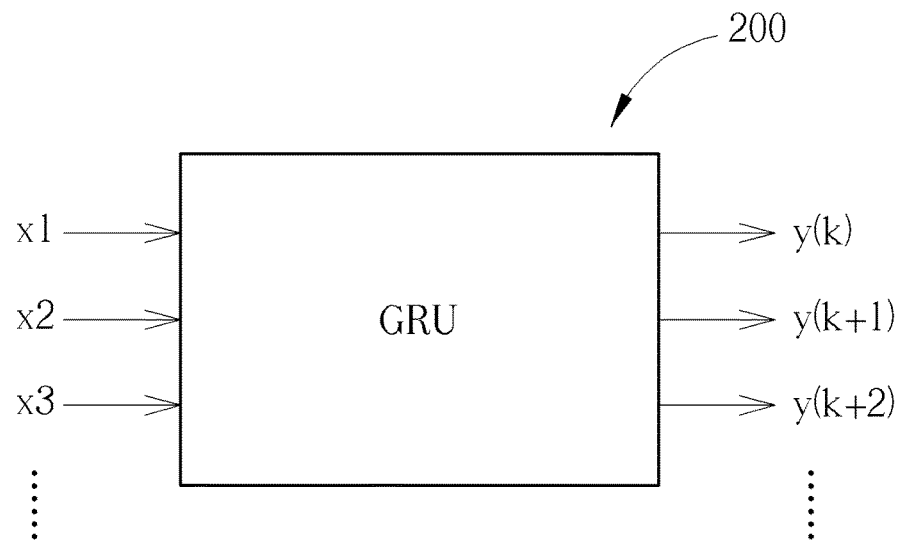
FIG. 2 is a schematic diagram of a temperature prediction model in an embodiment of the present invention.
Figure 3:
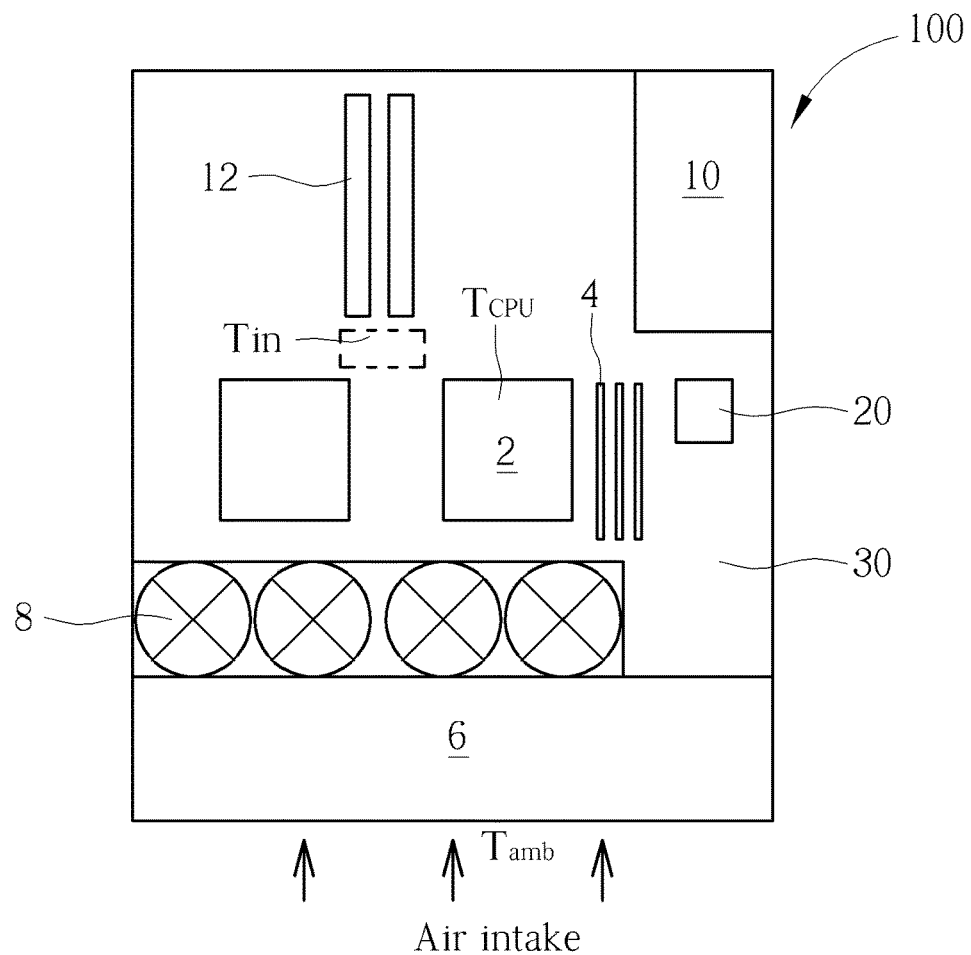
FIG. 3 is another schematic diagram of the temperature prediction system in FIG. 1.

Please refer to FIGS. 2 and 3. FIG. 2 is a schematic diagram of a temperature prediction model 200 in an embodiment of the present invention. FIG. 3 is another schematic diagram of the temperature prediction system 100. In this embodiment, a gated recurrent unit (GRU) in a recurrent neural network (RNN) is used as the architecture of the temperature prediction model 200. Because the recurrent neural network can remember past historical data, using this deep learning framework can effectively predict future trends from historical data. The goal of the temperature prediction model 200 is to infer output data y(k), y(k+1), y(k+2) . . . from the training data x1, x2 . . . of the known input terminals. k is the sampling point, and the sampling period is 1 second, but not limited to this. The choice of training data has an absolute impact on the accuracy of the prediction system. The embodiment selects the following training data: the intake air temperature $T_{amb}$ of the server 30, the fan speed of the fan module 8, the temperature $T_{CPU}$ of the central processing unit 2, the power P of the PCIe card 12, and the inlet temperature $T_{in}$ of the PCIe card 12. In addition, the output data of the temperature prediction model 200 is the chip temperature $T_{PCIE}$ of the PCIe card 12. The generation of training data, the storage and processing of data, and the training and evaluation of the temperature prediction model 200 can be implemented in an automated manner through programs.

rate, 50% utilization rate, 75% utilization rate and 100% utilization rate, which is the main heat source affecting the downstream PCIe card 12. In the embodiment, the fan speed, the chip power P of the PCIe card 12, and the utilization rate of the CPU 2 can be controlled by the program, and the intake air temperature $T_{amb}$ of the server 30, the temperature $T_{CPU}$ of the CPU 2 and the chip temperature $T_{PCIE}$ of the PCIe card 12 can be detected to train the temperature prediction model 200. In the design stage of the server 30, a thermocouple sensor can be used in advance to sense the chip of the PCIe card 12, thereby obtaining the temperature of the chip. After the training is completed, the chip on the PCIe card 12 does not have a thermocouple sensor, but the temperature prediction model 200 in the embodiment can be used to predict the change of the chip temperature $T_{PCIE}$.

TABLE 2

| | Input features | | | | | Errors | |
| | $T_{amb}$ | $T_{CPU}$ | $T_{in}$ | P | U | RMSE | Greatest error |
|---|---|---|---|---|---|---|---|
| 1 | x | x | o | o | o | 1.107 | 5.478 |
| 2 | x | o | x | o | o | 0.737 | 6.356 |
| 3 | o | x | x | o | o | 5.706 | 13.666 |
| 4 | x | o | o | o | o | 0.371 | 2.548 |
| 5 | o | x | o | o | o | 1.020 | 4.69 |
| 6 | x | o | x | o | o | 0.487 | 2.95 |
| 7 | o | o | o | o | o | 0.395 | 2.684 |

Table 2 is an error analysis of the results after training under various input features. The error data is an illustration of the experimental results according to the present invention, and is not used to limit the present invention. In Table 2, o represents this feature is being used, and x represents this feature is not being used. The chip power P and fan speed U of the PCIe card 12 are both key features. From the root mean square error (RMSE) analysis, adding $T_{amb}$, $T_{in}$, and $T_{CPU}$ can produce a relatively small error range (the fourth group of input features). Therefore, the embodiment selects the chip power P of the PCIe card 12, the fan speed U, the temperature $T_{CPU}$ of the central processing unit 2, and the inlet temperature Tin of the PCIe card 12 as the key features of the temperature predictor. However, the present invention is not limited to this. In another embodiment, the key features can include any combination of the features in Table 2.

TABLE 1

| Control variables | Control range | Control range adjustment | | | | | | |
|---|---|---|---|---|---|---|---|---|
| Chip of PCIe card | ON/OFF | ON | | | OFF | | | |
| CPU utilization rate | 0-100% | Idle | 25% | 50% | | 75% | 100% | |
| Fan speed | 30-100% | 30 | 40 | 50 | 60 | 70 | 80 | 90 | 100 |
| Server inlet temperature | 18-25° C. | | | | 18-25° C. | | | |

Figure 4:
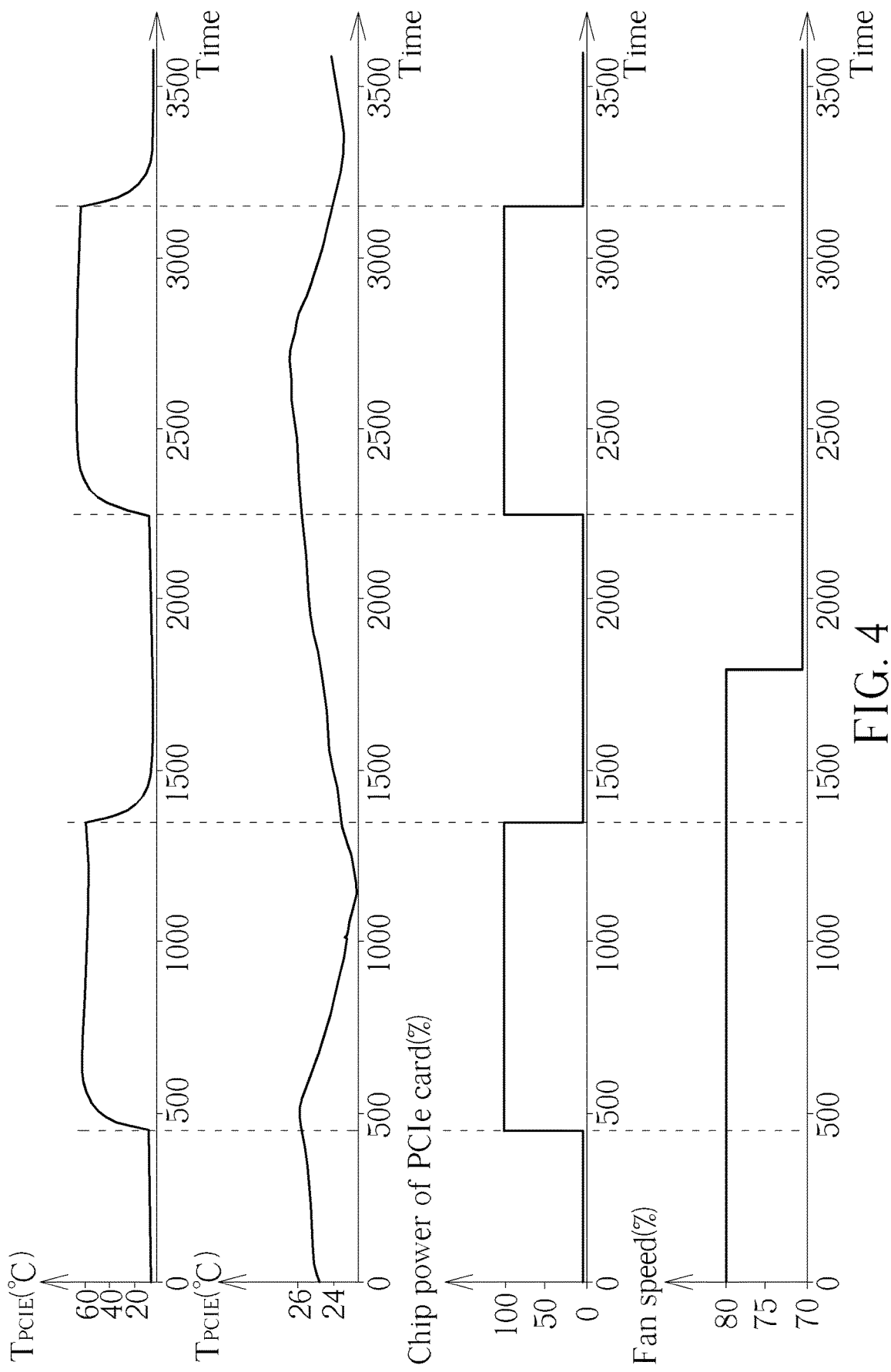
FIG. 4 is a training diagram of the temperature prediction model in FIG. 2.

With reference to the control variables in Table 1, the control range adjustment is only for illustration and is not used to limit the present invention. Control variables can be used to generate input data for predictive models. The chip power P of the PCIe card 12 may be in one of two states: ON and OFF. The control signal of the fan speed U is a pulse-width modulation (PWM) signal which may correspond to one of eight states: 30% speed, 40% speed, 50% speed, 60% speed, 70% speed, 80% speed, 90% speed and 100% speed. The utilization rate of the central processing unit 2 may be in one of five states: idle state, 25% utilization FIG. 4 is a training schematic diagram of the temperature prediction model 200 in an embodiment of the present invention. In the embodiment, the central processing unit 2 is in an idle state and uses the control variables of Table 1 to train the temperature prediction model 200. When the chip of the PCIe card 12 is in the ON state, the chip power of the PCIe card 12 is 100%, the chip temperature $T_{PCIE}$ increases. When the chip of the PCIe card 12 is in the OFF state, the chip power of the PCIe card 12 is 0%, the chip temperature $T_{PCIE}$ drops. The temperature $T_{CPU}$ of the central processing unit 2 changes with the switching of the chip of the PCIe card 12. The fan speed U during training has two modes: 80% and 70%. The training data generated by the control variables and other parameters in this embodiment can be used to train the temperature prediction model 200 so that the output data of the temperature prediction model 200, that is, the chip temperature $T_{PCIE}$, can be close to the measured temperature.

Figure 5:
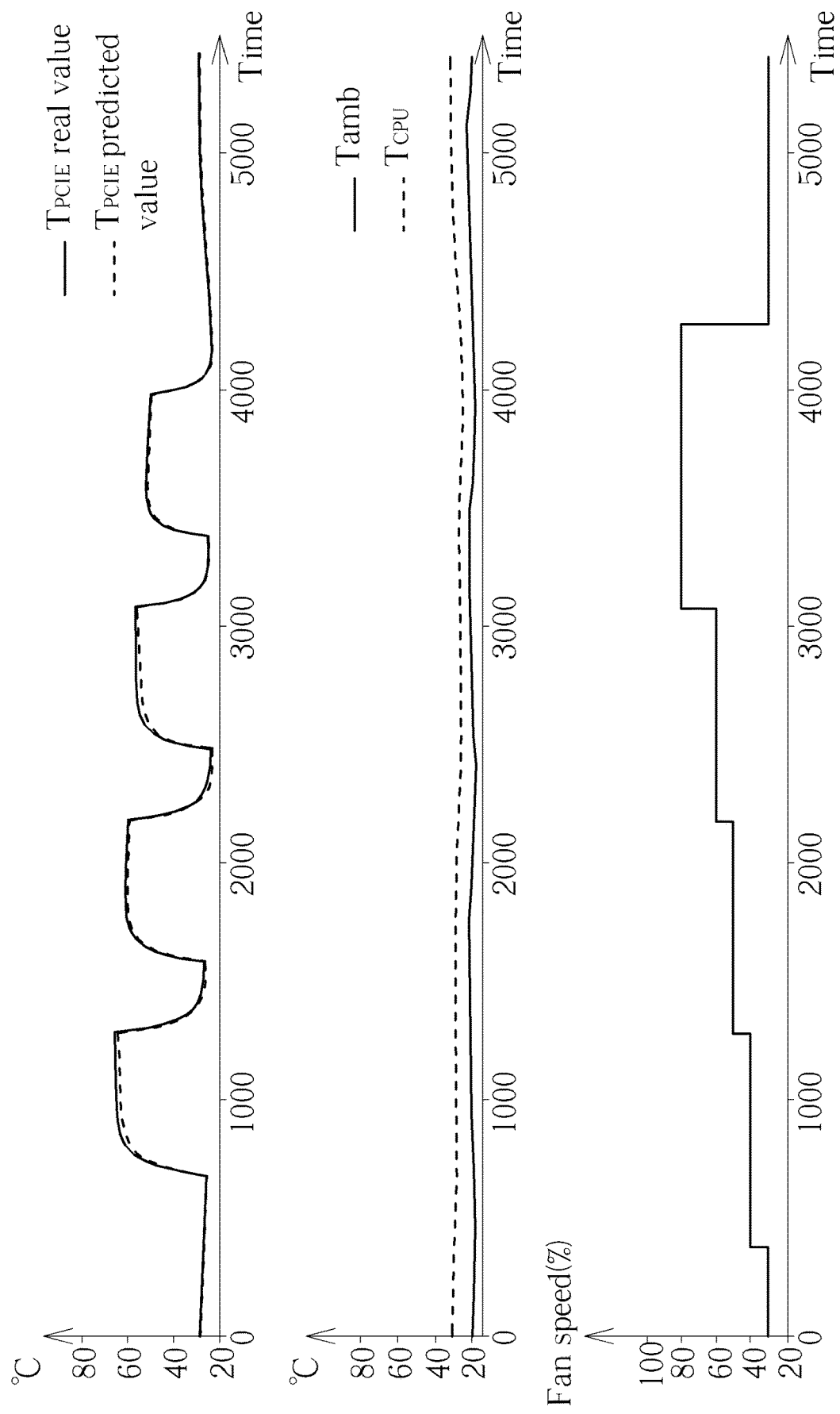
FIG. 5 is a prediction diagram of the temperature prediction model in FIG. 2.

FIG. 5 is a schematic diagram of the prediction of the temperature predictor in an embodiment of the present invention. The temperature predictor is formed by the key features of the temperature prediction model 200. In FIG. 5, when the fan speed of the fan module 8 gradually increases from 40% to 80%, the temperature $T_{CPU}$ of the CPU 2 and the intake air temperature $T_{amb}$ of the server 30 do not change much. However, the chip temperature $T_{PCIE}$ of the PCIe card 12 is lowered as the chip of the PCIe card 12 is turned on and the fan speed increases. Moreover, the actual value of the chip temperature $T_{PCIE}$ of the PCIe card 12 is quite close to the predicted value, which proves that the temperature predictor can actually predict the chip temperature $T_{PCIE}$ of the PCIe card 12.

In summary, the embodiment discloses a temperature prediction system and method for the PCIe chip of the server, including training data and output data for defining the temperature prediction model of the PCIe chip of the server, using the training data to train and test the temperature prediction model, adjusting the temperature prediction model so that the output data of the temperature prediction model is close to the measured value, and using the temperature prediction model and the temperature predictor formed by the key features to predict the temperature of the chip of the PCIe card. In this way, the temperature change of the chip of the PCIe card can be predicted, solving the time delay problem of the fan speed response.

In an embodiment of the present invention, the temperature predictor and method for the PCIe chip can be applied to a server. The server can be used in artificial intelligence (AI) operations and edge computing. The server can also be a 5G server, cloud server or car networking server.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for predicting a temperature of a chip of a PCIe card of a server comprising:
   using a gated recurrent unit of a recurrent neural network to define a temperature prediction model for the chip, the temperature prediction model comprising an input terminal and an output terminal;
   collecting training data of the temperature prediction model according to mutual response changes of a plurality of control variables;
   using the training data to train the temperature prediction model at the input terminal to obtain a training result close to a measured temperature of the chip from the output terminal, and evaluate the training result to obtain a plurality of features that best reflect the temperature change of the chip;
   performing an error analysis on the training result to obtain a set of key features from the plurality of features;
   forming a temperature predictor according to the set of key features and the temperature prediction model; and
   generating a predicted temperature of the chip by the temperature predictor;
   wherein the plurality of features comprise any combination selected from a group consisting of a utilization rate of a processor, a fan speed of the server, chip power of the PCIe card, the measured temperature of the chip and an intake air temperature of the server; and
   the set of key features comprises the chip power of the PCIe card, the fan speed of the server, the temperature of the processor and the intake air temperature of the server.

2. The method of claim 1 wherein the plurality of control variables comprise:
   the chip power of the PCIe card being in an on state or an off state;
   the utilization rate of the processor being in an idle state, 25% utilization rate, 50% utilization rate, 75% utilization rate or 100% utilization rate;
   the fan speed of the server being 30% of full speed, 40% of full speed, 50% of full speed, 60% of full speed, 70% of full speed, 80% of full speed, 90% of full speed or 100% of full speed; and
   the intake air temperature of the server being between 18° C. and 25° C.

3. The method of claim 2 wherein the training data comprises the utilization rate of the processor, the fan speed of the server, the chip power of the PCIe card and the measured temperature of the chip.

4. The method of claim 3 wherein the measured temperature is obtained from a thermocouple sensor disposed on the chip.

5. The method of claim 1 wherein the error analysis is a root mean square error analysis.

6. The method of claim 1 further comprising controlling a fan speed of the server according to the predicted temperature of the chip.

7. A temperature prediction system comprising:
   a server comprising a PCIe card and a fan;
   a temperature predictor comprising:
     a temperature prediction model defined by a gated recurrent unit (GRU) of a recurrent neural network (RNN) for a chip of the PCIe card; and
     a set of key features that best reflects a temperature change of the chip, comprising chip power of the PCIe card, a fan speed of the server, a temperature of the processor and an intake air temperature of the server; and
   a baseboard management controller configured to control the temperature prediction model to generate a predicted temperature of the chip of the PCIe card according to the set of key features, and control the fan speed of the server according to the predicted temperature.

* * * * *